(12) United States Patent
Stenestam et al.

(10) Patent No.: US 7,089,145 B2
(45) Date of Patent: Aug. 8, 2006

(54) TAP CHANGER CONDITION DIAGNOSING

(75) Inventors: Bengt-Olof Stenestam, Ludvika (SE); Gunnar Andersson, Nyhammar (SE)

(73) Assignee: ABB Technology Ltd., Zürich (CH)

( * ) Notice: Subject to any disclaimer, the term of this patent is extended or adjusted under 35 U.S.C. 154(b) by 416 days.

(21) Appl. No.: 10/450,578

(22) PCT Filed: Dec. 14, 2001

(86) PCT No.: PCT/SE01/02785

§ 371 (c)(1), (2), (4) Date: Jun. 16, 2003

(87) PCT Pub. No.: WO02/048730

PCT Pub. Date: Jun. 20, 2003

(65) Prior Publication Data

US 2004/0021449 A1 Feb. 5, 2004

Related U.S. Application Data

(60) Provisional application No. 60/255,424, filed on Dec. 15, 2000.

(51) Int. Cl.
*G01K 1/00* (2006.01)

(52) U.S. Cl. ...................................... 702/130; 702/136
(58) Field of Classification Search ................ 702/130, 702/136
See application file for complete search history.

(56) References Cited

U.S. PATENT DOCUMENTS 6,052,060 A 4/2000 Butler et al.
6,446,027 B1 * 9/2002 O'Keeffe et al. ........... 702/183

FOREIGN PATENT DOCUMENTS

JP 01095506 4/1989
JP 10041162 2/1998

* cited by examiner

*Primary Examiner*—John Barlow
*Assistant Examiner*—Stephen J. Cherry
(74) *Attorney, Agent, or Firm*—Venable LLP; Eric J. Franklin

(57) ABSTRACT

A method and apparatus for condition diagnosing of a tap changer immersed in a cooling fluid, controlling and regulating an inductive power device, such as a transformer or reactor. The diagnosing method compares and evaluates expected heat exchanges between the tap changer and ambient air and the inductive power device, an expected amount of heat generated by the tap changer during operation, together with an actual temperature of the fluid. From the actual temperature, expected heat exchanges and expected generated heat, the heat balance in the system may be obtained and is used for disgnosing the operation conditions of the tap changer. The results from the condition diagnosing may be used as indicators that can alarm operators or may be sent as a data signal to remote and/or portable display means, such as a computer.

30 Claims, 7 Drawing Sheets

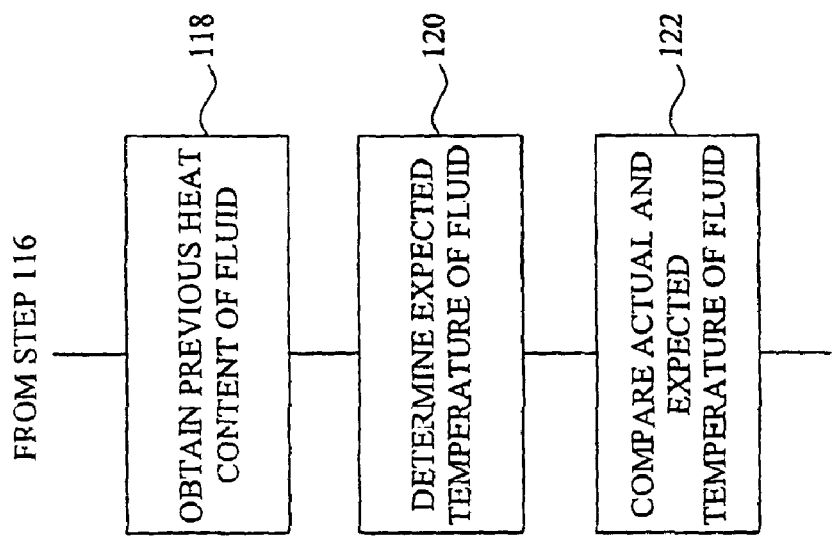
Fig. 7c
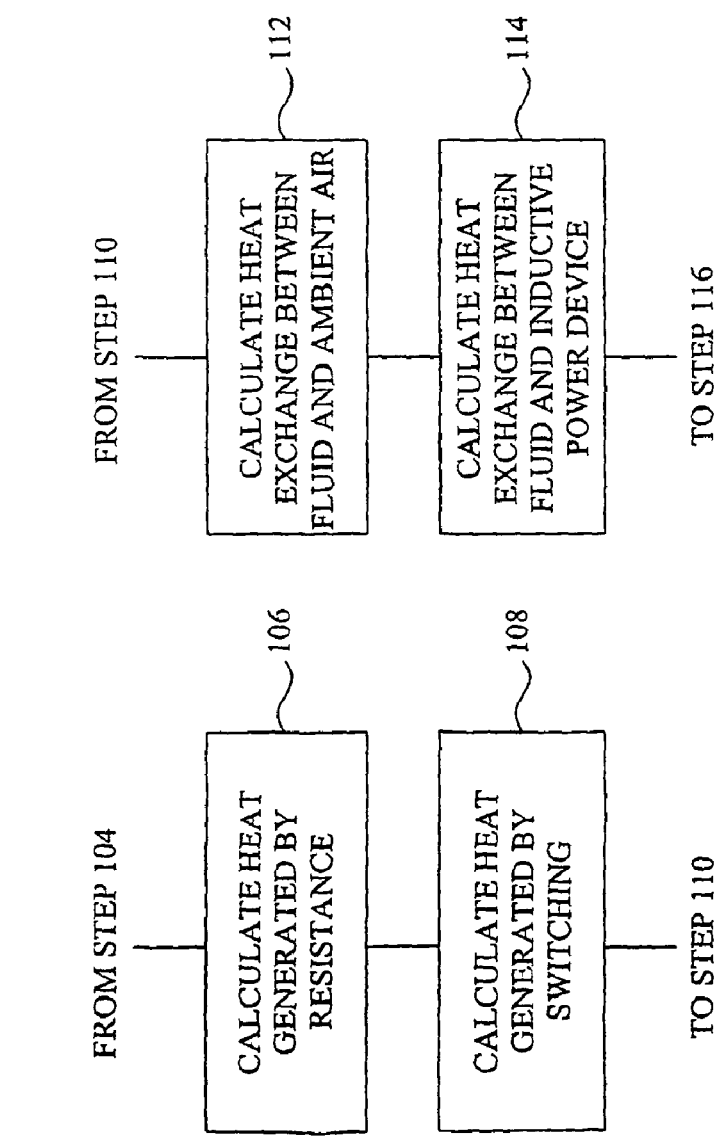
Fig. 7b
Fig. 7a

US 7,089,145 B2

TAP CHANGER CONDITION DIAGNOSING

CROSS-REFERENCE TO RELATED APPLICATIONS

This application is the National Phase under 35 U.S.C. § 371 of PCT/SE01/02785 filed Dec. 14, 2001, which claims the benefit of the filing date of U.S. provisional patent application 60/255,424 filed Dec. 15, 2000.

TECHNICAL FIELD

The present invention generally relates to tap changers and in particular to a method and apparatus for condition diagnosing of such tap changers.

BACKGROUND

Tap changers are widely used today to regulate and control the output of large or medium sized inductive power devices, such as transformers and reactors. These inductive power devices transform electric power from a first power system to a second power system. As the load of the second system increases, the output voltage of the inductive power device drops. In order to compensate for this output voltage drop, i.e. maintain a relatively constant output voltage level in the second power system, or adjust the output voltage in accordance with power board customers requirements, the tap changers are used.

The tap changer controls and regulates the voltage transformation for transformers and inductance for reactors. In a transformer, the voltage of the second system depends on a turn ratio, i.e. the ratio between the number of turns between the secondary and primary winding of the transformer. The tap changer, most often being connected to the primary winding, affects this turn ratio by performing a switching between different fixed contacts or taps of the winding. This switching is typically performed in small steps resulting in a voltage change of about 0.5–2.5%, usually around 1.5%, of the rated voltage per step.

The tap changer becomes heated by its operations but also by the load and is therefore immersed in a cooling fluid, most often oil. The cooling fluid acts at the same time as an insulating medium. But since arcing normally occur during switching operations the oil may deteriorate and deterioration products are formed in the fluid. In order not to contaminate the inductive power device, the tap changer is preferably separated from the fluid of the inductive power device and is placed in fluid filled tank, in turn being located either in or on the tank of the inductive power device.

Since the tap changer and the fluid become heated during operation, a monitoring of the tap changer is often employed to maintain a reliable and efficient operation. In such a monitoring, several parameters may be measured and observed to get a picture of the overall condition of the tap changer. In particular the temperature of the cooling and insulating fluid needs to be kept below a certain safety limit. Breakdowns, possibly leading to the destruction of the entire or part of the tap changer or a shortening of its life may happen if the fluid temperature exceeds certain limits. In some situations also the inductive power device may be affected, damaging its equipment of shortening its life.

In the patent JP 10041162 an abnormality diagnostic device for a tap changer is disclosed. The device has a torque detector to detect a torque of a drive shaft of the tap changer. A temperature detector detects the temperature of the tap changer. Based on this detected temperature, a correction operation is carried out on a standard torque pattern. The corrected standard torque pattern is then compared with the detected torque pattern of the drive shaft in order to diagnose any abnormality.

U.S. Pat. No. 6,052,060 discloses an oil immersed electric power switch-gear, such as a tap changer, with an oil circulating system filtering formed carbon particles from the oil. The circulating system is provided with a temperature probe for measuring the temperature of the oil leaving a tank containing the tap changer. The measured temperature is compared with setpoint values to detect a possible too high oil temperature. In order to prevent or minimise equipment damage due to the high oil temperature alarms are issued and/or electrical loads are disconnected.

Most prior art monitor and diagnosing systems, such as the one described in U.S. Pat. No. 6,052,060 above, concern protection against acute damage to the tap changer and its associated equipment. The systems most often base the condition diagnosing of the tap changer on a direct temperature measurement of the cooling and insulating fluid and perform actions if the temperature exceeds certain safety thresholds. Thus, any actions are only taken if the fluid temperature is high enough and the situation therefore is or soon may become critical. Such emergency actions may include load reduction and in extreme conditions shutting down the tap changer and inductive power device. However, a malfunctioning tap changer may not necessarily lead to a dangerous heating at all instances. A malfunctioning tap changer may e.g. operate at a low load and will then, despite its defects, operate at a permitted temperature. No indication of the defect is detected until the load and power is increased. At such an occasion, it is often very inconvenient to take the tap changer out of operation for repair, since it typically coincides with an increased performance demand.

It would therefore be advantageously if one, as a complement to the conventional overtemperature protection devices, could achieve an apparatus for providing information about the actual operation condition, related to heat issues, of the tap changer at any instant, i.e. a condition diagnosing apparatus.

SUMMARY

An object of the present invention is to provide condition diagnosing of tap changers, giving a more complete picture of the operation conditions of the tap changer at any operational state.

It is a further object of the invention to provide a diagnosing method, which accurately detects equipment malfunctions and/or external factors affecting the operation even in situations when the tap changer operates with a low power load.

Another object of the invention is to provide an early fault detection before severe damages have occurred.

The above objects are achieved by apparatuses and methods according to the enclosed claims. In general words, the operation conditions of a tap changer, immersed in a fluid and controlling and regulating an inductive power device, are diagnosed by obtaining and evaluating an expected amount of heat generated by the tap changer, an expected resulting heat exchange of the tap changer, together with an actual temperature of the fluid.

The expected amount of generated heat is the heat that is generated during operation of the tap changer, and is expressed in a preferred calculation model as a sum of a heat generated by a normal operation resistance of the tap changer and a heat generated during the actual switching operation of the tap changer. The amount of heat generated by the resistance arises when the load current flows through the current lines and main contact of the tap changer. Due to the material properties of the current lines and main contact, i.e. a resistance larger than zero, heat is generated during operation and is dissipated into the fluid. During switching operation heat is generated partly by the flow of the load current and partly by an arising circulating current through transition resistors of the transition contacts. Since the expected amount of generated heat depends on the load current of the tap changer, a value of the load current is measured and used in the calculation models for the expected generated heat.

The expected resulting heat exchange of the tap changer is a sum of any heat flows on one hand between the tap changer and the ambient air and on the other hand between the tap changer and the inductive power device. A heat exchange between the tap changer and the ambient air and a heat exchange between the tap changer and the inductive power device are therefore calculated and summed. The former heat exchange, i.e. between the air and the tap changer, depends on the temperature difference therebetween, whereby the actual temperature of the fluid and a temperature of the ambient air are measured. The heat exchange between the tap changer and inductive power device depends likewise on a temperature difference, but now between a temperature of the inductive power device and the actual temperature of the fluid, which therefore are measured.

The heat balance of the tap changer system is then investigated by comparing and evaluating the obtained expected resulting heat exchange, expected generated heat and the actual temperature of the fluid in order to detect any non-expected operation conditions. In a preferred comparison embodiment an expected temperature of the fluid is calculated from the expected amount of generated heat, the expected resulting heat exchange and a previous heat content of the fluid. This calculated expected fluid temperature is then compared with the actual measured fluid temperature. During ideal expected operation conditions the expected fluid temperature would be substantially equal to the actual fluid temperature. A divergence from equality is an indication of non-expected operation conditions. Such conditions may include non-expected heat generating sources, such as heat generated by an increased contact resistance of the tap changer contacts and/or heat generated during a faulty switching operation, where the tap changer becomes stuck in an intermediate position or if the switching operation is too slow. Other non-expected sources that may affect the operation of the inductive power device include external factors, such as weather conditions.

The present diagnosing method may preferably be performed several times in order to get a more complete picture of the operation conditions of the tap changer.

The main advantage with the present invention is that it provides a condition diagnosing of tap changers that is able to detect malfunctions and other effects affecting the operation of the tap changer even in such situations when most prior art methods fail. This means that a malfunction may be detected and taken care of before the load of the tap changer increases and the situation becomes critical.

SHORT DESCRIPTION OF THE DRAWINGS

The invention together with further objects and advantages thereof, may best be understood by making reference to the following description taken together with the accompanying drawings, in which.

Figure 5:
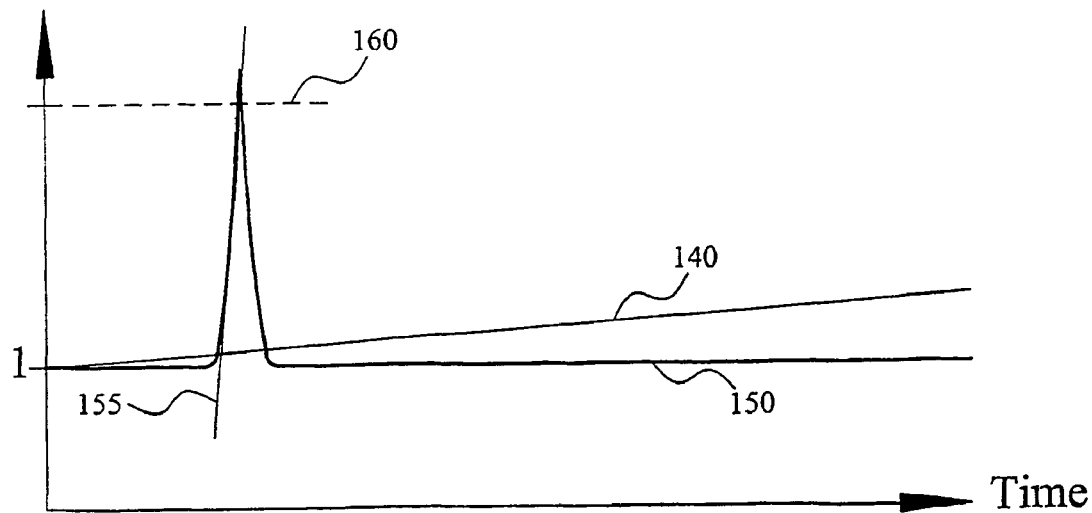
Figure 6:
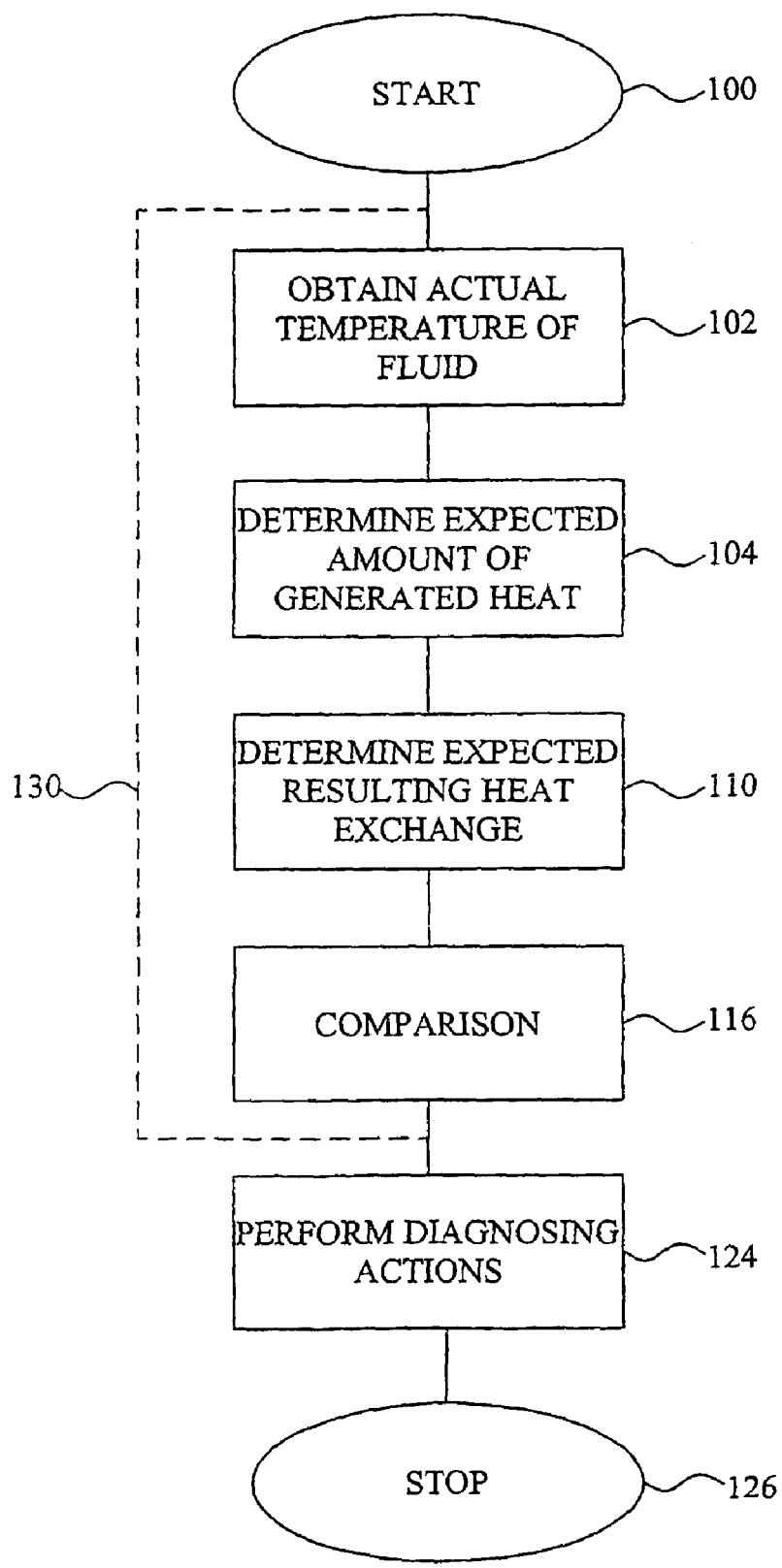
Figure 8:
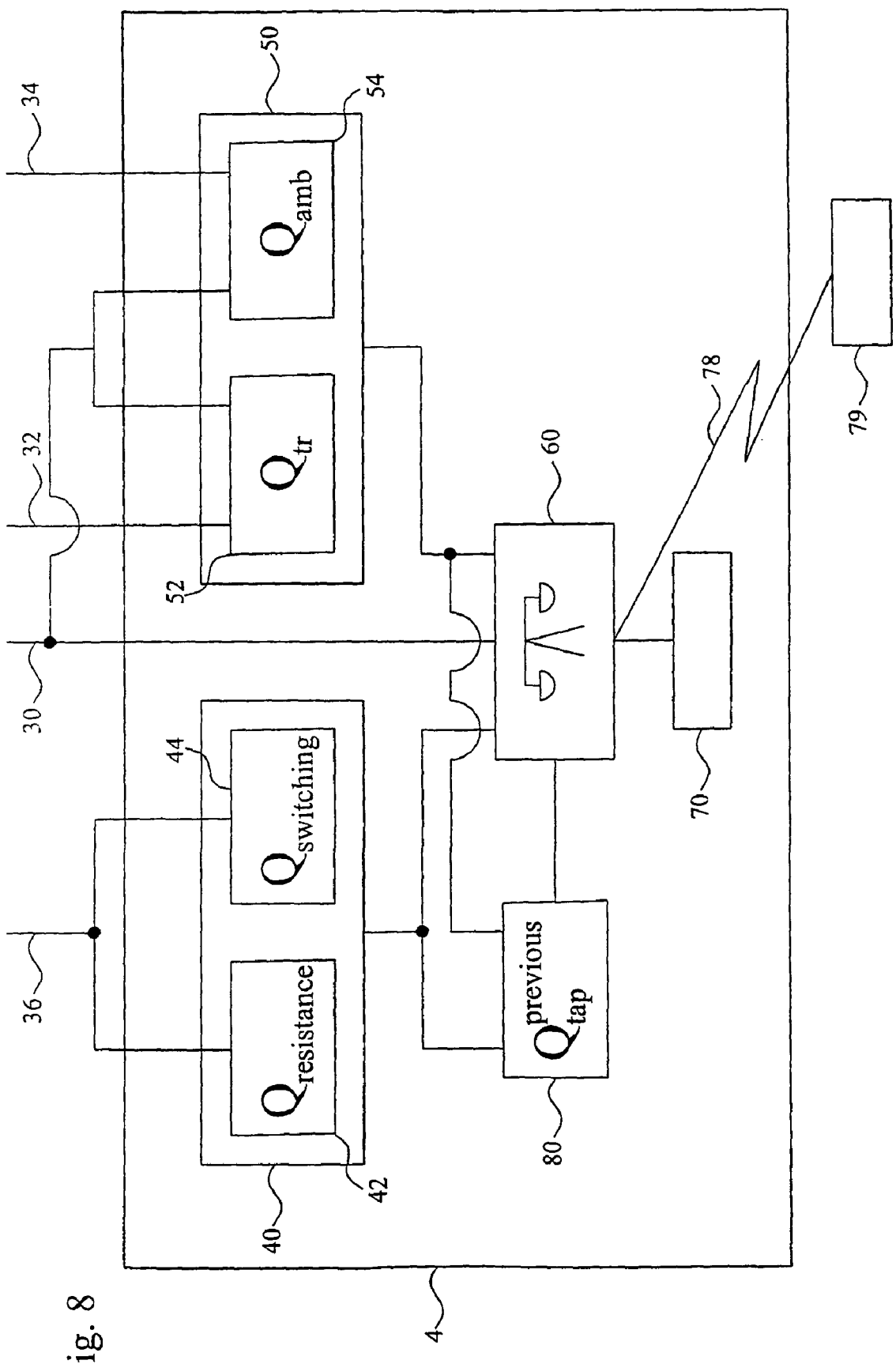
Figure 9A:
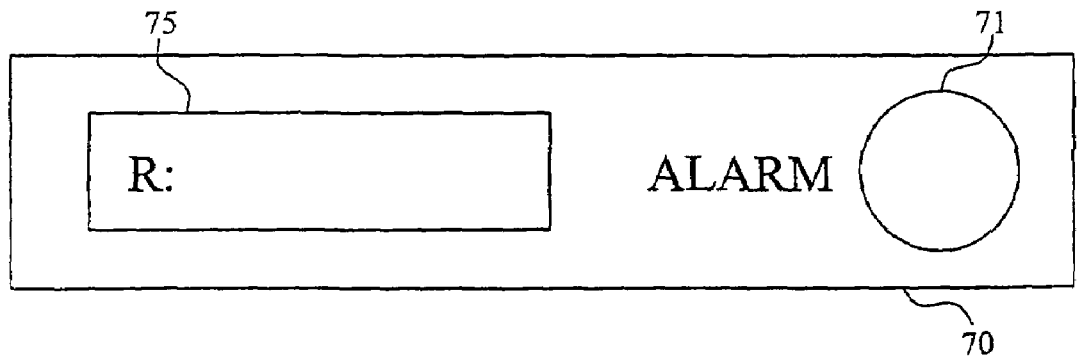
Figure 9B:
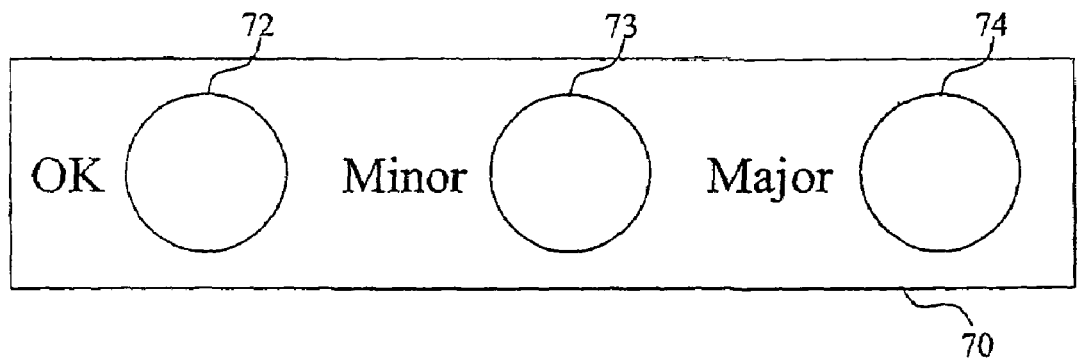
Figure 9C:
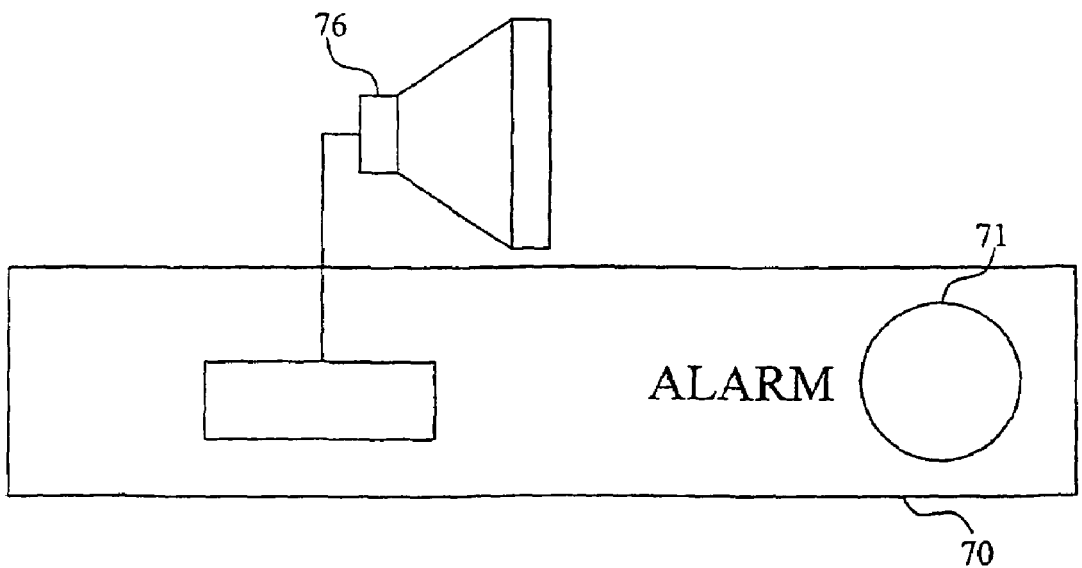

FIGS. 4a–e illustrate an example of a switching operation of tap changers;

FIG. 5 is a diagram showing an example of a ratio of a measured top fluid temperature of a tap changer and a calculated top fluid temperature versus time;

FIG. 6 is a flow diagram of the general steps of the condition diagnosing method according to the present invention;

FIGS. 7a–c illustrate flow diagrams of embodiments of performing three of the steps of FIG. 6;

FIG. 8 is a block diagram of an embodiment of a condition diagnosing apparatus according to the present invention; and FIGS. 9a–c are different illustrations of embodiments of indicators usable with the condition diagnosing according to the present invention.

DETAILED DESCRIPTION

Tap changers of today and in particular the inductive power devices they control and regulate are expensive arrangements and are therefore often equipped with protection systems. Such systems are arranged to monitor the operation of the tap changer and perform control actions if the operation exceeds certain safety operation thresholds. A typical quantity having an operation threshold is the temperature of a fluid that cools and insulates the tap changer. If such a temperature increases too much, damage to the tap changer and associated equipment may arise. Consequently, the goal of many protection systems is to monitor and/or control the temperature of the fluid. The control actions of the systems are basically activated when the temperature exceeds the safety threshold, and consequently the protection systems may be referred to as acute damage protection systems. The performed emergency actions might include reduction of the load and in extreme situation shutting down the tap changer and inductive power device. However, situations may arise when the emergency actions of prior art monitor and control systems are insufficient or performed too late, leading to damage to the tap changer. The prior art emergency actions may also come at an inconvenient time, e.g. during increased load demands.

The resistance of contacts of the tap changer may increase during time and operation. There are miscellaneous reasons for this increased contact resistance, including carbonization. This increase in resistance leads to an increased heat generation when the load current flows through the tap changer. Since it takes a long time, in the order of months, for the increase in resistance to become large enough to cause problems with increased heat generation, the prior art protection systems and methods with only temperature measurements will not detect the increased resistance until the increased heat generation is seriously large Another fault situation that generates heat is when a tap changer during a switching operation becomes stuck in an intermediate position connected to two fixed contacts or if the switching operations are performed too slowly. In such a case, load current or load current and an arising circulating current will pass through transition resistors of the tap changer causing an increased temperature of the cooling fluid. Although this heat generation is larger and more rapid than the heat generation caused by increased contact resistance, it still takes time until a rise of the overall fluid temperature can be significantly detected. The temperature of the fluid in the vicinity of the malfunctioning tap changer increases rapidly but due to the properties of the cooling fluid, the overall temperature of the total fluid increases much slower. If the tap changer becomes stuck in this intermediate position for a relative long time, in this context in the order of several minutes, the generated heat will burn off the transition resistors. But if the tap changer is not permanently stuck, but is operating too slowly, i.e. a switchig operation takes longer take than expected, the transition resistors will not burn off and the emergency temperature level might not be reached at all. In such a case the prior art systems may fail to detect the malfunctioning of the tap changer.

Yet another typical situation where prior art systems and methods with only top fluid temperature measurements encounter problems is when external factors, such as the external temperature and weather conditions, affect the operation of the tap changer. Since most tap changer control and monitor systems do not take such external factors into consideration, safety thresholds may consequently be violated without any real emergency situation.

Since most of the prior art control systems and methods are directed to emergency actions, the systems may come across problems particularly when the tap changer and inductive power device are loaded at only a fraction of their rated capacity. During such a low power operation, the tap changer may be operated within its safety thresholds, e.g. below the maximum allowed fluid temperature, even if equipment malfunctions or external affecting factors, as described above, are present. However, if the conditions suddenly change, such as a suddenly increased power load, the malfunctions or external factors may cause the tap changer to exceed the safety thresholds before the emergency actions of the control systems have an effect. As a result, damages to the tap changer equipment may arise, leading to increased cost for the operator. This cost is not only in the form of cost of repairs but may also be as lost operation if the damages are so severe that the inductive power device controlled by the tap changer, at least temporarily, must be shut off. Even if the control system actions are efficient enough to save the tap changer from damage, the detection of the malfunction often comes at an inconvenient time.

The present invention is directed to another aspect of operation of tap changers than the prior art systems, briefly described above. Whereas the prior art systems concern emergency and acute damage protection, the present invention relates to a condition diagnosing of heat status of tap changers. Malfunctions and other factors that possibly may lead to equipment damages may be detected at an early stage by the condition diagnosing, even at low power load, i.e. long before the risk for damages normally occurs. The present invention will give an operator indications of the operation conditions of the tap changer during operation. These indications may then be used for monitoring and/or controlling, continuously or at intermittent occasions, operation of the tap changer. As a consequence, the indicators may be used for alarming the operator if the operation conditions are such that safety threshold may be violated if the power load increases. The operator may then perform required actions to repair or compensate for the faulty conditions before costly damages occur. Such actions can then be scheduled to a convenient moment in the operation of the tap changer.

Figure 1:
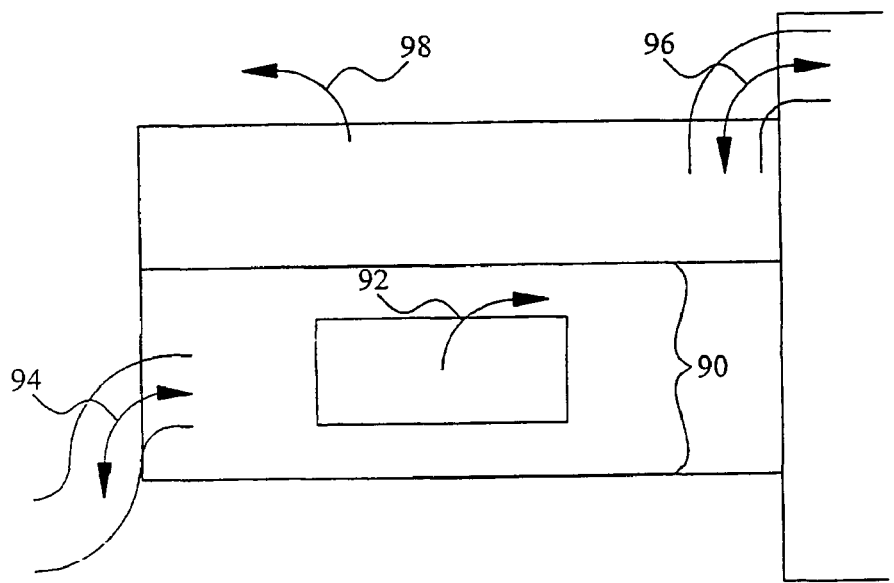
FIG. 1 is a schematic overview of heat flows in a tap changer system.

Referring to FIG. 1, the basic principle on which the condition diagnosing of the present invention is established is illustrated. FIG. 1 schematically illustrates the flows of heat into and out from a fluid that cools the tap changer together with heat generated by the tap changer. The actual heat content 90 of the tap changer depends on the expected amount of heat 92 that is generated by the tap changer and an expected resulting heat exchange from/to the tap changer. The expected resulting heat exchange in turn consists of two different heat exchange contributions, a heat exchange 94 between the fluid and the ambient air surrounding the tap changer and a heat exchange 96 between the fluid and the inductive power device that the tap changer is controlling. Both heat exchanges 94, 96 can in theory be positive, negative or zero. The heat exchange 94 between the fluid and the ambient air is in the present description defined to be positive if heat is flowing from the air and into the fluid and negative if the opposite is true, i.e. heat flows from the fluid into the air. As a consequence, if the heat exchange 94 is positive the ambient temperature is higher than the temperature of the fluid. The heat exchange 96 between the fluid and the inductive power device is in the present description defined to be positive if heat is flowing from the inductive power device into the fluid. With a negative heat exchange 96, heat is flowing from the fluid into the inductive power device. Thus, a positive heat exchange 96 implies a higher temperature of the inductive power device than the fluid temperature of the tap changer. Note that the temperature of the inductive power device actually is the temperature of the fluid cooling the inductive power device, but to reduce any risk of mixing up the temperature of the fluid cooling and insulating the tap changer and the temperature of the fluid cooling the inductive power device, the latter is in the present description simply referred to as the temperature of the inductive power device.

The condition diagnosing of the present invention measures an actual temperature of the fluid cooling the tap changer. The expected amount of heat 92 generated by the tap changer and the expected resulting heat exchange of the tap changer are then determined. These heat contributions are then compared with the measured fluid temperature in order to detect any non-expected operation. Consequently, the condition diagnosing compares and evaluates heat contributions in addition to the measured fluid temperature in the tap changer system, and derives indications of heat balances of the system. This is in contrary to prior art systems that mainly are directed to temperature measurements and temperature protection. The emergency actions of these prior art systems are to reduce the temperature, i.e. the heat content 90, of the tap changer. Their main goal is therefore to prevent the heat 90 or fluid temperature of the tap changer from becoming too large, which is schematically illustrated with the arrow 98.

The condition diagnosing of the present invention will now be described with a tap changer controlling and regulating an inductive power device in form of a power transformer. As a person skilled in the art understands, a transformer is merely an illustrative embodiment of an inductive power device, to which a tap changer according to the present invention may be applied. The invention is therefore not limited to transformers, but may also be applied to other inductive power devices, such as reactors.

Figure 2:
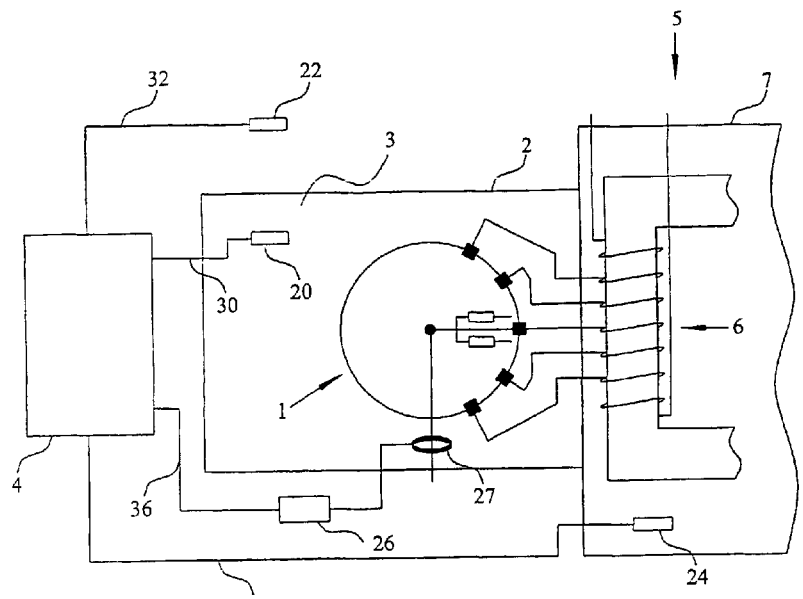
FIG. 2 is a schematic drawing of a tap changer and a part of a power transformer, provided with sensors, according to the present invention.

Referring to FIG. 2, a tap changer 1 immersed in a tank 2 containing a cooling and insulating fluid 3 is illustrated. The tap changer 1 controls and regulates the output voltage of a transformer 5 by switching between different fixed contacts or taps of a regulating winding 6 of the transformer 5. The fluid 3 of the tap changer 1 functions both as a cooling medium transferring heat generated by the tap changer 1 to the surrounding air, typically by heat dissipation through the walls of the tap changer tank 2, and as an insulating medium.

The tap changer 1 of FIG. 2 is provided with a number of sensors 20, 22, 24 and 26 registering temperature of the fluid 3, ambient temperature, temperature of the transformer 5 as well as load current through the tap changer 1. The temperature of the fluid 3 cooling and insulating the tap changer 1 is measured by a thermometer 20 arranged in the tap changer tank 2. The thermometer 20 is preferably placed in the top portion of the tank 2, thus measuring a top fluid temperature.

The ambient temperature is a measure of the temperature of the air surrounding the tap changer 1. This temperature is measured by a weather-protected thermometer 22 that is arranged in vicinity of the tap changer tank 2, preferably in direct contact with the surrounding air.

A thermometer 24 in the transformer 5 measures the temperature of the transformer 5, actually the temperature of the fluid cooling the transformer 5, its core and regulating windings 6.

A pick-up coil 27 is arranged to get a direct estimation of the load current through the tap changer 1. The pick-up coil 27 is in turn monitored by e.g. an amperemeter 26 or similar current measuring means.

The data registered by the sensors is then forwarded, on temperature connections 30, 32 and 34 and a current connection 36, to a condition diagnosing apparatus 4. The condition diagnosing apparatus 4 may be provided in connection to the tap changer tank 2, implemented as whole in remote control systems or implemented partly in connection to the tap changer tank 2 and partly in remote control systems.

Figure 3:
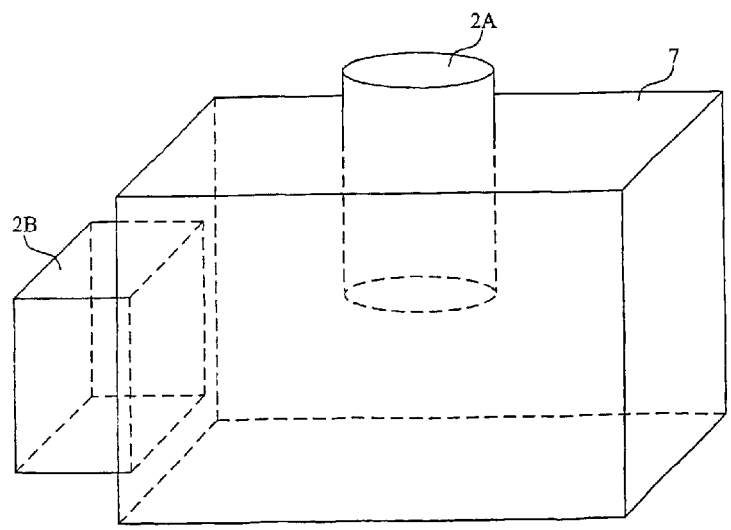
FIG. 3 is a schematic drawing showing possible mounting configurations of a tap changer in relation to a transformer tank.

The tap changer tank 2 as illustrated in FIG. 2 is arranged outside of a transformer tank 7 containing the regulating windings 6. But as is shown in FIG. 3 the tap changer tank 2A, 2B may be mounted either on the outside of the transformer tank 7 or inserted, protruding into the transformer tank 7. For large transformers the tap changer tank 2A most often is arranged inserted in the transformer tank 7, whereas for smaller transformers the tap changer tank 2B may be mounted as in FIG. 2, i.e. on the outside of the transformer tank 7. The condition diagnosing method of the present invention may be applied to either type of tap changer. The major difference between the two tap changer types in FIG. 3, is that the difference between the transformer temperature and the actual temperature of the tap changer fluid is usually smaller for tap changers mounted inside 2A of the transformer tank 7 than for those which are mounted outside 2B thereof. Another difference is that the area through which heat may dissipate from the fluid of the tap changer to the ambient air is smaller for inside mounted tap changers 2A than for outside mounted ones 2B. Actually, the present condition diagnosing method may be applied to any tap changer regardless of where it is mounted in relation to the transformer it is controlling and regulating.

Figure 4A:
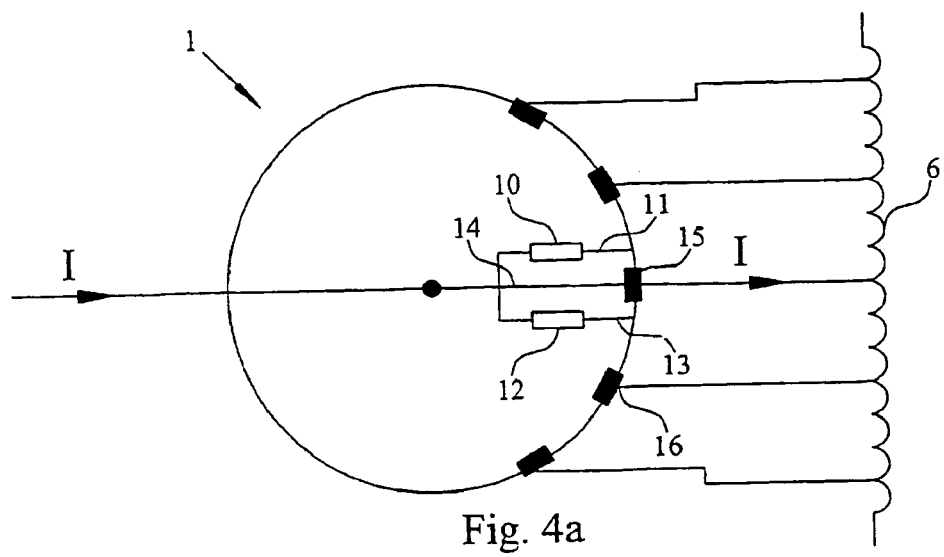

In order to understand how the tap changer generates heat during operation and possible sources that increase the heat generation at e.g. equipment damages, FIGS. 4a–4e illustrate a tap changer 1 in more detail during a possible switching operation. In FIG. 4a, a main contact 14 is connected to a fixed contact or tap 15, which in turn is connected to a regulating winding 6 of a transformer. A first 11 and a second 13 transition contact with respective first 10 and second 12 transition resistor are open and resting in the spaces between the fixed contacts. As a consequence all load current I is carried by the main contact 14. In the following Figs. the tap changer 1 switches from the fixed contact 15 to a next fixed contact 16.

Firstly, the first transition contact 11 connects to the fixed contact 15. In this position both the main contact 14 and the first transition contact 11 is connected to the fixed contact 15. The main contact 14 is then disconnected from the fixed contact, as in FIG. 4b. The load current I now flows through the first transition contact 11 and its associated first transition resistor 10. In this step, an increased amount of heat is generated due to the flow of the load current I through the first transition resistor 10.

Figure 4B:
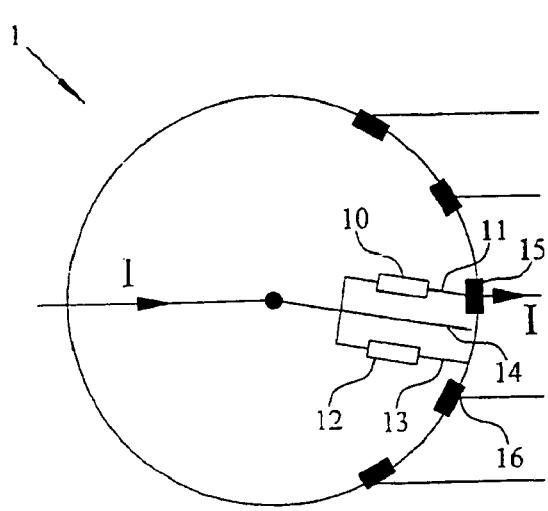
Figure 4C:
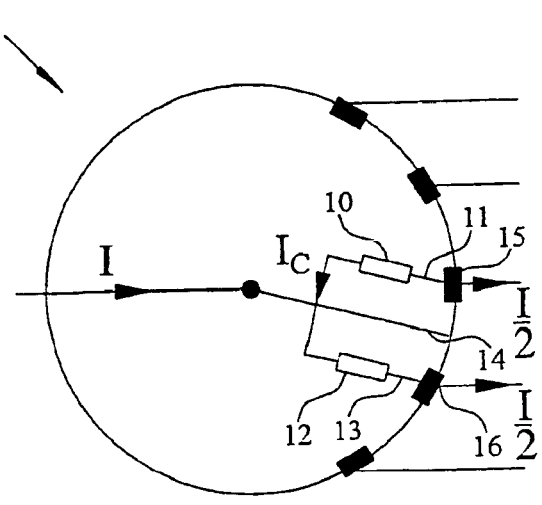

In the next step, illustrated in FIG. 4c, the tap changer 1 moves so that the second transition contact 13 connects to the next fixed contact 16 at the same time as the first transition contact 11 still is connected to the fixed contact 15. The load current I is divided in essentially two equal parts between the first 11 and second 13 transition contacts, respectively. In addition, a circulating current $I_C$ arises, which flows through the first 11 and second 13 transition contacts with associated transition resistors 10, 12 and the two fixed contacts 15, 16, to which the tap changer 1 is connected. Due to the first 10 and second 12 transition resistor, respectively, this circulating current $I_C$ is limited. In this step, an even larger amount of heat is generated due to the flow of both the load current I and the circulating current $I_C$ through the transition resistors 10, 12.

Figure 4D:
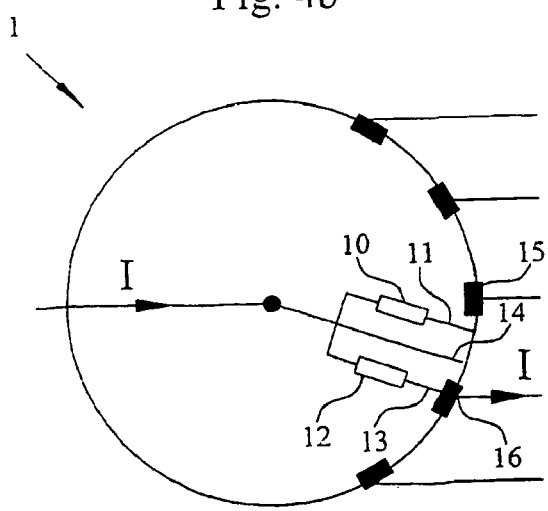

The first transition contact 11 has been disconnected from the fixed contact 15 in FIG. 4d. However, the second transition contact 12 is still connected to the next fixed contact 16 and thus carries together with its associated transition resistor 12 all the load current I. As in FIG. 4b, heat is generated due the flow of the load current I through one of the transition resistances, in this case the second transition resistor 12.

The main contact 14 then connects to the next fixed contact 16, which also is connected to the second transition contact 12. The switching operation is completed in FIG. 4e, where the main contact 14 is connected to the next fixed contact 16 and the second transition contact 13 has been disconnected. Thus, in this position the load current I is carried only by the main contact 14.

A malfunctioning that can cause a non-expected operation condition is an increased resistance in any of the current-carrying contacts of the tap changer 1. This increase might have miscellaneous reasons, but lack of operations or very few switching operations is normally the reason or at least a part of the reason. Also depositing of formed deterioration products onto the contacts may increase their resistance. If the resistance of tap changer 1 increases also the heat generated by the load current I increases. Thus, the malfunctioning situation causes an increased amount of heat generation that may cause problems to the operation of the tap changer 1 and in extreme situations also equipment damages.

Another malfunctioning situation that causes non-expected heat generation is when the tap changer 1 becomes stuck in an intermediate position or operates too slowly during the switching operation. This intermediate position corresponds to the positions of the tap changer 1 in FIGS. 4b–d. In these positions the load current I, or the load current I and the circulating current $I_C$ in FIG. 4c, flows through the transition resistors 10, 12. The current flows through the resistors 10, 12 cause heat generation that in turn heats the fluid. If the tap changer 1 becomes permanently stuck, the transition resistors 10, 12 will burn off, with a risk of severe damages to the tap changer as well as the transformer. But if the tap changer 1 is operating too slowly so that the switching operation takes longer time than expected, the generated heat may not be large enough to burn off the transition resistors 10, 12. Such a prolonged switching operation may proceed in the order of seconds or with some equipment damages in the order of minutes. Compared to the heat generated by increased resistance of contacts, much more heat is generated during a much shorter time with a stuck or slow-switching tap changer 1.

In order to perform the comparison of the condition diagnosing method of the present invention an actual temperature $T_{tap}$ of the tap changer fluid is needed. This actual fluid temperature $T_{tap}$ is preferably obtained from direct temperature measurements. The fluid of the tap changer is in most operation conditions divided into two different fluid fractions, a lower cool fraction and a warm upper fraction. During operation the tap changer heats the surrounding fluid. As the fluid becomes heated it floats upwards to the upper fraction containing warm portions of the fluid. From this fraction heat normally dissipates through the tap changer tank to the surrounding air. As heat leaves the fluid it becomes cooled and floats back to the lower fluid fraction. In a first embodiment of the present invention only the temperature of the top fluid is measured. Since this temperature most often will be the highest temperature of the fluid, it is important to measure and monitor it in order to detect if the fluid temperature exceeds safety thresholds. The temperature distribution in each fluid fraction is fairly homogenous throughout the whole fluid volume of respective fraction. It may therefore be sufficient to measure the top fluid temperature in only one location. However, in some non-steady state operations where the temperature distribution not yet has become homogenous several thermometers may be arranged in different locations in the upper fluid portion. The actual fluid temperature $T_{tap}$ is then obtained by averaging the registrations from all or some of these thermometers. In another embodiment of the present invention not only the top fluid temperature but also the bottom fluid temperature is measured. In this embodiment thermometers are arranged both at top and bottom locations in the tap changer tank. Thus, in order to obtain the actual fluid temperature $T_{tap}$ the top and bottom fluid temperatures are averaged. It may also be possible to have several thermometers in the top and/or bottom fluid fractions, whereby the measured values from some or all of these thermometers are used in the temperature averaging.

The expected amount of heat $Q_{heat}^{expected}$ generated by the tap changer is preferably the expected amount of heat that is caused by a resistance of the current lines and main contact of the tap changer $Q_{resistance}$ and the switching operations $Q_{switching}$. Thus, the expected amount of heat $Q_{heat}^{expected}$ is a sum of these two heat-generating contributions, i.e. calculated as:

$$Q_{heat}^{expected} = Q_{resistance} + Q_{switching}.$$

Figure 4E:
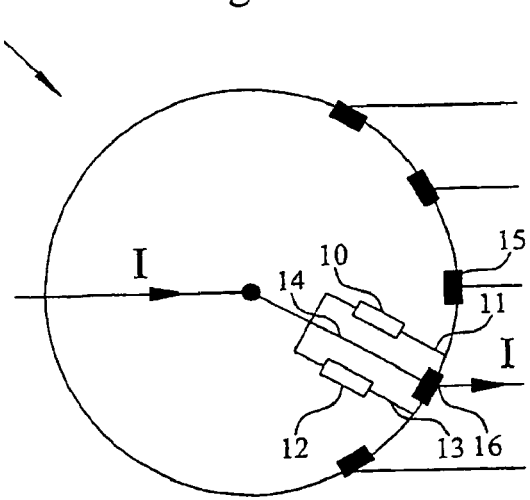

The heat $Q_{resistance}$ caused due to the resistance is generated when the load current I is floating through the current lines and the main contact in FIGS. 4a and 4e. The main contact and the current lines have, because of properties of the material of the contact and lines, a resistance R that is larger than zero. The load current I floating through the non-zero resistance current lines and main contact generates heat that dissipates into the surrounding fluid, which thereby becomes heated. The heat $Q_{resistance}$ generated due to the resistance may as a simplification be determined from:

$$Q_{resistance} = RI^2 \Delta t,$$

where R is the resistance of the current lines and main contact of the tap changer and $\Delta t$ is the time interval during which the load current I is flowing. A better model would be to calculate the generated power at one time instant, using the load current I at that particular instant, and then once more calculate the generated power at another instant using the load current I of that instant. In order to get the generated heat $Q_{resistance}$ due to the resistance of the tap changer the two time-separated calculated powers are averaged and multiplied with the time interval separating them. Another model could be based on several measurements of the load current I over time and calculations of the generated power at each measurement time. The resistance generating heat $Q_{resistance}$ is then obtained by averaging all calculated powers and multiplying by the length of the time interval. If the load current I may be expressed as a function of time the generated heat $Q_{resistance}$ may be obtained from integration over time.

A calculation model for the heat $Q_{switching}$ generated by the switching operations of the tap changer depends on how the actual switching is performed. Different switching operations, such as a symmetric flag cycle, are possible, depending on the actual design of the tap changer. For instance, the number of steps of the switching may vary from tap changer to tap changer. The calculation model below is based on a switching operation according to FIGS. 4a–4c. Thus, in the present model the heat $Q_{switching}$ generated by the switching substantially consists of three contributions corresponding to the position of the tap changer in FIGS. 4b–4c. The heat $Q_{switching}$ generated by the switching may as a simplification be expressed as:

$$Q_{switching} = R_{trans}I^2\Delta t_1 + 2R_{trans}\left[\left(\frac{I}{2}\right)^2 + I_C^2\right]\Delta t_2 + R_{trans}I^2\Delta t_3,$$

where $R_{trans}$ is a transition resistance, $I_C$ is a circulating current and $\Delta t_1$, $\Delta t_2$, $\Delta t_3$ are time intervals, during which the different switching steps take place.

Referring to FIG. 4b, the first term in the expression for the switching generated heat $Q_{switching}$ is the heat caused when the first transition contact 11 is connected to the fixed contact 15. The load current I then floats through the first transition resistor 10 with a resistance of $R_{trans}$.

The second term of the expression of the switching generated heat $Q_{switching}$ corresponds to the step in FIG. 4c. In this step, both transition contacts 11, 13 are connected to the regulating winding 6 through the fixed contacts 15, 16. Thus, half the load current I floats through each transition resistor 10, 12, if their corresponding resistance $R_{trans}$ is equal. In addition to this divided load current flow I, a circulating current $I_C$ is flowing through the transition resistors 10, 12. This current $I_C$ arises due to a voltage between the two fixed contacts 15, 16. As a consequence, the total current through one 12 of the transition resistors is half the load current I plus the circulating current $I_C$, whereas for the other transition resistor 10 the total current is half the load current I subtracted by the circulating current $I_C$. In order to get the total generated power, the generated powers from the two transition resistors 10, 12 are added.

The third and final term in the calculation model for the heat generated by the switching operation $Q_{switching}$ corresponds to FIG. 4d. In this Fig. the second transition contact 13 is connected to the fixed contact 16 so that the load current I flows through the second transition resistor 12 with a resistance $R_{trans}$.

In the calculation model for the switching operation $Q_{switching}$ above, it is assumed that the first 10 and second 12 transition resistor has equal magnitude of their associated resistances $R_{trans}$. However, for some tap changers it may be possible that the resistance of the first transition resistor 10 differs from the resistance of the second resistor 12. The calculation model then has to be conformed according to the different resistance value. The number of transition resistors varies for different types of switching priciples and the formula then should be conformed accordingly.

The expected resulting heat exchange $Q_{change}^{expected}$ of the tap changer preferably consists of two heat exchange contributions, a heat exchange $Q_{amb}$ between the fluid of the tap changer and the ambient air and a heat exchange $Q_{tr}$ between the fluid and the transformer. Thus, the resulting heat exchange $Q_{change}^{experted}$ may be expressed as:

$$Q_{change}^{expected} = Q_{tr} + Q_{amb}.$$

In a preferred calculation model, the heat exchange $Q_{amb}$ is determined based on a difference between the ambient temperature $T_{amb}$ and the actual fluid temperature $T_{tap}$. As a consequence, the heat exchange $Q_{amb}$ between ambient air and the tap changer may be expressed as:

$$Q_{amb} = fkn(T_{amb} - T_{tap})\Delta t,$$

where $\Delta t$ is a time interval during which the temperatures are measured and fkn( ) is a function. The function depends not only on the temperature difference between ambient and tap changer temperatures but also on e.g. geometric considerations, specific heat capacity of the fluid and air, respectively, flowing conditions inside and outside of the tap changer etc. Thus, in order to calculated the heat exchange $Q_{amb}$ these factors should be considered. Measurements of the ambient temperature $T_{amb}$ may be performed with one or several thermometers at different locations in the vicinity of the tap changer tank.

The heat exchange $Q_{tr}$ is preferably determined based on a difference between the temperature of the transformer $T_{tr}$ and the actual fluid temperature $T_{tap}$. The heat exchange $Q_{tr}$ may therefore be expressed as:

$$Q_{tr} = fkn(T_{tr} - T_{tap})\Delta t,$$

where $\Delta t$ is a time interval during which the temperatures are measured and fkn( ) is a function. As for the function of the heat exchange $Q_{amb}$ between the air and the tap changer, the function not only depends on the temperature difference between transformer and tap changer but also on e.g. geometric considerations, specific heat capacity of the tap changer fluid and the fluid of the transformer, respectively, flowing conditions inside the tap changer and transformer etc. The transformer temperature $T_{tr}$ may be measured with one or several thermometers. A top and bottom transformer temperature may preferably be measured corresponding to the top and bottom temperature of the transformer fluid, respectively. The transformer temperature $T_{tr}$ may then be obtained by averaging these different temperature measurements.

The expected resulting heat exchange $Q_{change}^{expected}$ may be positive, negative or zero. In the first case, i.e. a positive value, there is a net heat flow into the fluid, which therefore becomes heated. On the other hand, if the expected resulting heat exchange $Q_{change}^{expected}$ is negative there is a net heat flow out from the fluid, whereas a zero value corresponds to a zero net heat flow.

The calculation models above for calculating the heat generated by the resistance of the tap changer or during the switching operations and the heat exchange between the fluid and the air or the fluid and the transformer are merely illustrative examples of possible thermodynamic models. As was mentioned above, the model for the switching operation depends on how the actual switching is performed. Also for the other heat contributions and exchanges other models exit taking more or less factors into consideration in the calculations and give a more or less accurate calculation.

A comparison between the actual temperature $T_{tap}$ of the fluid, the expected amount of heat $Q_{heat}^{expected}$ generated by the tap changer and the expected resulting heat exchange $Q^{changeexpected}$ of the tap changer is then performed to get indications of heat balances of the tap changer system. The comparison is preferably performed by calculating an expected temperature $T_{tap}^{expected}$ of the fluid based on the expected generated heat $Q_{heat}^{expected}$ and the expected resulting heat exchange $Q_{change}^{expected}$. In a possible calculation model the expected fluid temperature $T_{tap}^{expected}$ is determined as:

$$T_{tap}^{expected} = \frac{Q_{heat}^{expected} + Q_{change}^{expected}}{c_{fluid} m_{fluid}} + \frac{Q_{tap}^{previous}}{c_{fluid} m_{fluid}},$$

where $c_{fluid}$ and $m_{fluid}$ are a specific heat capacity and a mass of the fluid, respectively, and $Q_{tap}^{previous}$ is a previous heat content of the fluid. The expected change in fluid temperature is obtained by summing the expected generated heat $Q_{heat}^{expected}$, the expected heat exchange $Q_{change}^{expected}$ and the previous heat content $Q_{tap}^{previous}$ and dividing the sum by the mass $m_{fluid}$ and specific heat capacity $c_{fluid}$ of the fluid. The specific heat capacity $c_{fluid}$ and the mass $m_{fluid}$ are characteristic properties of the fluid used and are normally obtained from the transformer manufacturer, from standard literature or by measurements.

The very first previous heat content of the fluid $Q_{tap}^{previous}$ is easily and accurately calculated from temperature measurements e.g. at starting or restarting of the tap changer and transformer. The calculated previous heat content $Q_{tap}^{previous}$ may then be stored in a memory. A subsequent previous heat content $Q_{tap}^{previous}$, used in a subsequent condition diagnosing, may be calculated starting from the stored value of the previous heat content $Q_{tap}^{previous}$ and adding the change in heat content of the fluid, i.e. the expected generated heat inflow $Q_{heat}^{expected}$ and the expected resulting heat exchange $Q_{change}^{expected}$.

The calculated expected temperature $T_{tap}^{expected}$ is then compared to the actual measured temperature $T_{tap}$ of the fluid. A divergence of equality between the actual $T_{tap}$ and expected $T_{tap}^{expected}$ fluid temperature may be an indication of a non-expected operation condition, including increased contact resistance, a stuck or slow-switching tap changer and/or external factors, such as the weather conditions. If a non-expected heat-generating source is present, whether internal in form of equipment damages or external, the expected temperature $T_{tap}^{expected}$ is most often smaller than the actual one $T_{tap}$. A ratio between the actual $T_{tap}$ and the expected $T_{tap}^{expected}$ fluid temperatures may be calculated.

During ideal expected operation conditions this ratio would be near one. A divergence from unity may then be an indication of non-expected operation.

Complementary to performing the condition diagnosing based on a single comparison between the measured actual fluid temperature and calculated expected fluid temperature, the general condition behaviour over time may be used. Several calculations of the expected generated heat $Q_{heat}^{expected}$ and the expected resulting heat exchange $Q_{change}^{expected}$ may be performed over time. At each time instant, or sample, the expected temperature $T_{tap}^{expected}$ of the fluid is determined from the calculated expected generated heat $Q_{heat}^{expected}$ and resulting heat exchange $Q_{change}^{expected}$, e.g. by using the calculation model above. The ratio between the actual fluid temperature $T_{tap}$ and the expected temperature $T_{tap}^{expected}$ may then be plotted versus time as in FIG. 5.

FIG. 5 illustrates two such ratios versus time for two different malfunctions. Starting with the line 140, this line 140 corresponds to the general behaviour of a tap changer with an increased contact resistance problem. The increased tap changer resistance leads to increased non-expected heat generation. However, an increase in contact resistance is a proportionately slow process. As a consequence, the resistance over the contacts builds up and increases over time, implying a slow increase in generated heat over time. Therefore, it takes time, in the order of months, to detect the resistance problem if the condition diagnosing is only based on fluid temperature measurements. But with a condition diagnosing according to the present invention the resistance problem may be detected much earlier by e.g. calculating the temperature ratio at some different time instants and then look for any trend of an increasing temperature ratio, such as the line 140.

The behaviour of another heat generating malfunctioning, viz. a tap changer temporarily stuck in an intermediate position during a switching operation or a tap changer with a too slow switching operation is illustrated with the curve 150. This course of heat generation is much faster than the heat from the increased contact resistance. A rather large amount of heat is generated represented by the spike of the curve 150. This course of events takes in the order of minutes, sometimes faster and sometimes slower. If no actions are taken the transition resistors may actually burn off due to the generated heat. The present condition diagnosing has a larger possibility compared with prior art condition diagnosing to detect and perform the required actions before any equipment damages occur. An indication of a malfunctioning switching operation present may be when the spike of the curve 150 exceeds a trip level 160. The level of this trip level 160 is preferably low enough so that the malfunctioning may be detected and diagnosing actions may be performed before any additional equipment becomes damaged due to the increased heat generation. A faster way to detect a malfunctioning switching is to look at the slope 155 of the spike of curve 150. A too large slope may be an indication of a malfunction and diagnosing actions may then be performed. If the temperature of the fluid is measured and calculated often enough, it may be possible to detect the malfunctioning switching based on the slope 155 in less than minutes, i.e. before trip levels 160 are exceeded. This early detection may become very important if equipment is to be saved in situations where the malfunctioning causes a large heat generation.

It may also be possible to perform the comparison between an actual heat content of the fluid, the previous heat content of the fluid and the expected amount of generated heat and expected resulting heat exchange, instead of between the actual and expected fluid temperatures. From the actual temperature of the fluid, the actual heat content thereof may be calculated using the mass and specific heat capacity of the fluid. Performance of diagnostic actions is then based on a comparison between the actual heat content of the fluid and an expected heat content, defined as the sum of the previous heat content, expected generated heat and expected resulting heat exchange. With ideal expected operation of the tap changer the expected heat content will be substantially equal to the actual heat content. Non-equality is an indication of non-expected operation conditions, such as extra heat generation due to e.g. increased contact resistance and/or a faulty switching operation.

The actions being based on the comparison diagnosing include indication of error functioning and may be performed if it is concluded that a non-expected heat generation source is present. This indication may be in the form of visual/audio indicators, alarming an operator of the non-expected operation by e.g. lightning an alarm lamp. Information of this indication may also be transmitted to a remote display means and/or portable display means carried by an operator. The operator may then correct the malfunctions or may compensate for the external factors during operation of the tap changer.

The condition diagnosing method of the present invention is summarised in FIGS. 6 and 7a–c. The condition diagnosing starts in step 100 of FIG. 6. In step 102, the actual temperature of the fluid is obtained, preferably from direct temperature measurements of the fluid. The expected amount of generated heat is determined in step 104, typically based on a load current of the tap changer. In step 110 the expected resulting heat exchange is determined. In addition to the actual fluid temperature, measurements of ambient and transformer temperatures are used in the heat exchange determination. A comparison between the obtained actual fluid temperature, the determined expected generated heat and expected resulting heat exchange is performed in step 116. Based on this comparison, diagnosing actions are performed in step 124 if a non-expected operation condition is detected. The actions include indication of error functioning and sending information thereof to display means. This indication may be in the form of visual/audio indicators, such as alarm lamps, alarming an operator of a possible non-expected operation. The diagnosing method is completed in step 126.

FIGS. 7a–c describe preferred manners to accomplish step 104, 110 and 116 in FIG. 6, in more detail.

In the preferred embodiment of determining the expected amount of generated heat of FIG. 7a, a heat generated by a resistance of the tap changer is calculated in step 106. This heat is generated when the load current flows through the current lines and the main contact of the tap changer. In step 108, a heat that is generated during switching operation is calculated. The load and circulating currents through the transition resistors cause this heat generation.

FIG. 7b is a preferred embodiment of determining the expected resulting heat exchange of step 110 in FIG. 6. In step 112, a heat exchange between the fluid and the ambient air is calculated based on the actual fluid temperature and the ambient temperature. A heat exchange between the fluid and the transformer is calculated in step 114. For this calculation the transformer temperature is needed in addition to the fluid temperature.

A preferred embodiment of accomplishing the comparison step 116 in FIG. 6 is shown in FIG. 7c. In step 118, a previous heat content of the fluid is obtained from a calculation or a memory. An expected temperature of the fluid is determined based on the expected generated heat, expected resulting heat exchange and previous heat content in step 120. This expected temperature is compared in step 122 with the actual temperature of the fluid. The performed diagnosing actions of step 124 in FIG. 6 are then based on this comparison.

The condition diagnosing method of the present invention may with advantage be performed several times, which is illustrated by the dashed line 130 in FIG. 6. The diagnosing may also be performed during different operational conditions. Such different conditions may e.g. include different ambient conditions, such as a sunny day, a cloudy day and during the night. During a sunny day the rays of the sun may heat the tap changer, thereby affecting the temperature of the fluid. By performing the condition diagnosing according to the present invention during the night this extra heat contribution from the sun is absent. If a non-expected operation condition is detected during such an ambient condition, a malfunction to tap changer equipment probably is present.

The method according to the present invention may be implemented as software, hardware, or a combination thereof. A computer program product implementing the method or a part thereof comprises a software or a computer program run on a general purpose or specially adapted computer, processor or microprocessor. The software includes computer program code elements or software code portions that make the computer perform the method using at least one of the steps previously described in FIG. 6 and preferably also in FIGS. 7a–c. The program may be stored in whole or part, on, or in, one or more suitable computer readable media or data storage means such as a magnetic disk, CD-ROM or DVD disk, hard disk, magneto-optical memory storage means, in RAM or volatile memory, in ROM or flash memory, as firmware, or on a data server.

The basic elements of an embodiment of a condition diagnosing apparatus 4 according to the present invention will now be described with reference to FIG. 8. The expected amount of heat generated by the tap changer is determined by means 40 of the condition diagnosing apparatus 4. The means 40 receives a representation of the load current of the tap changer on a current connection 36. In means 40, a means 42 for calculating the heat generated by the resistance of the tap changer and a means 44 for calculating the heat generated during the switching operations are preferably arranged. The means 42 and 44 base their calculations on the load current representation of current connection 36.

The expected resulting heat exchange of the tap changer is determined by means 50. Representations of actual fluid temperature, transformer temperature and ambient temperature are forwarded on temperature connections 30, 32 and 34 to the means 50. The means 50 advantageously comprises a means 52 for calculating a heat exchange between the fluid and the transformer and a means 54 for calculating a heat exchange between the fluid and the ambient air. The calculating means 52 is connected with the temperature connections carrying information of the actual fluid temperature 30 and the transformer temperature 32, whereas the means 54 is connected with the temperature connections carrying information of the actual fluid temperature 30 and the ambient temperature 34.

A representation of the expected amount of generated heat from means 40 is input to performance means 60. The performance means 60 also receives a representation of the expected resulting heat exchange, from means 50. The temperature connection 30 forwards a representation of the actual fluid temperature to the performance means 60, which compares the received representations. If the operation conditions of the tap changer are considered as undesirable, the performance means 60 sends signals to indicators 70 and/or transmits signals 78 to remote or portable display means 79 (which will be described in more detail below). The indicators 70 and display means 79 subsequently indicate the undesirable condition as error functioning, giving an operator an alarm signal by e.g. lighting an alarm indicator.

In addition, in the present embodiment, the performance means 60 may calculate an expected temperature of the fluid based on the expected generated heat from means 40, the expected resulting heat exchange from means 50 and a previous heat content of said fluid from memory means 80. The memory means 80 stores a representation of the previous heat content and updates this represenation between measurements by adding the expected generated heat from means 40 and the expected resulting heat exchange from means 50. The comparison may then be performed by comparing this expected fluid temperature with the actual fluid temperature from the temperature connection 30. A ratio between the actual and expected fluid temperature may be derived by performance means 60. This ratio is then sent to the indicators 70 and/or transmitted 78 to the display means 79.

With reference to FIGS. 9a–c, the indicators 70 of the diagnosis apparatus may be in the form of visual 71, 72, 73, 74, 75 and/or audio 76 indicators that can alarm an operator if the operation conditions of the tap changer are non-expected. In a first embodiment the indicators 70 may be in the form of only indicating if the operation of the tap changer is OK or non-expected. This may be indicated by an indicator lamp 71 that, e.g. may be lit during non-expected operation or is lit with different colours depending on the operation conditions. It may also, as in FIG. 9b, be possible to have an indicator lamp for each operation condition, e.g. OK 72, minor fault 73 and major fault 74. In addition, a display screen, as the screen 75 in FIG. 9a, may be provided to display actual numbers representing e.g. the actual fluid temperature, the expected fluid temperature and/or the ratio between these fluid temperatures. This gives an operator more detailed information of the operation conditions of the tap changer than if only lamp indicators are used. The visual indicators 71, 72, 73, 74, 75 may be complemented with audio indicators 76, that may give an alarm audio signal if the operation conditions are particular bad, i.e. corresponding to the major fault indicator 74 of FIG. 9b. Actually, as a person skilled in the art understands, any form of indicator whether visual, audio or some other type, may be used by the present condition diagnosing.

Instead of or as a complement to the indicators 70 a display means 79 may be used. The signal 78 of a non-expected operation condition is then transmitted as a data signal from the performing means 60 to the display means 79, which may constitute e.g. a remote display means, such as a computer with receiving means and/or a portable display means. The signal 78 may be transmitted as a radio signal, an infrared signal or any other form of electromagnetic signal. The display means may in turn comprise indicators 71, 72, 73, 74 and 76 that give a visual and/or audio alarm if the operation conditions of the transformer are non-expected. A display screen 75 may also be arranged in the display means 79. On the screen 75 actual numbers can be displayed, representing e.g. fluid temperatures and temperature ratios.

The information carried by the signal 78, i.e. the operation conditions of the tap changer, is preferably at least partly formatted according to a standard that is suitable for a web technology means for communication and/or remote execution. Such a standard, makes it possible to display the information carried by the signal 78 by a web based computer program, such as a web browser. The standards may include, but are not limited to Hyper Text Markup Language (HTML), Extensible HTML (XHTML), Extensible Markup Language (XML), Simple Object Access Protocol (SOAP) and Wireless Device Markup Language (WDML).

The performing means 60 preferably includes formatting means and a transmitter to carry out formatting of the information of the signal 78 according to the preferred standard and transmitting the signal 78 to the display means 79. In a preferred embodiment, the performing means 60 is compatible with wireless standards specifying an "over-the-air" interface between the performing means 60 and the remote and/or portable display means 79. Such standards may include IEEE 802.11, HomeRF, a standard of the Bluetooth Special Internet Group (SIG), or if the signal is transmitted as infrared waves, IrDA and IrCOMM standards.

It will be understood by those skilled in the art that various modifications and changes may be made to the present invention without departure from the scope thereof, which is defined by the appended claims.

The invention claimed is:

1. A method for condition diagnosing of a tap changer controlling an inductive power device, said tap changer being immersed in a fluid, the method comprising:
    obtaining an actual temperature ($T_{tap}$) of said fluid;
    determining an expected amount of heat ($Q_{heat}^{expected}$) generated by said tap changer;
    determining an expected resulting heat exchange ($Q_{exchange}^{expected}$) of said tap changer; and
    performing diagnosing actions based on a comparison between said actual temperature ($T_{tap}$) of said fluid, said expected amount of generated heat ($Q_{heat}^{expected}$) and said expected resulting heat flow ($Q_{heat}^{expected}$).

2. The method according to claim 1, wherein determining said expected resulting heat exchange ($Q_{heat}^{expected}$) of said tap changer comprises:
    calculating a heat exchange ($Q_{amb}$) between the ambient air and said fluid; and
    calculating a heat exchange ($Q_{tr}$) between said inductive power device and said fluid.

3. The method according to claim 2, wherein calculating said heat exchange ($Q_{amb}$) between the ambient air and said fluid comprises:
    measuring an ambient temperature ($T_{amb}$) whereby said calculation of said heat exchange ($Q_{amb}$) between the ambient air and said fluid is based on a difference between said ambient temperature ($T_{amb}$) and said actual temperature ($T_{tap}$) of said fluid.

4. The method according to claim 2, wherein calculating said heat exchange ($Q_{tr}$) said inductive power device and said fluid comprises:
    measuring a temperature ($T_{tr}$) of said inductive power device, whereby said calculation of said heat exchange ($Q_{tr}$) between said inductive power device and said fluid is based on a difference between said temperature ($T_{tr}$) of said inductive power device and said actual temperature ($T_{tap}$) of said fluid.

5. The method according to claim 1, wherein determining said expected amount of heat ($Q_{heat}^{expected}$) generated by said tap changer comprises:
    obtaining a value (I) of a load current in said tap changer.

6. The method according to claim 5, wherein determining said expected amount of heat ($Q_{heat}^{expected}$) generated by said tap changer comprises:
    calculating heat ($Q_{resistance}$) generated by a resistance of said tap changer; and
    calculating heat ($Q_{switching}$) generated due to switching of said tap changer.

7. The method according to claim 6, wherein said heat ($Q_{resistance}$) generated by said resistance of said tap changer is determined from:

$$Q_{resitance} = RI^2 \Delta t,$$

where R is a resistance of said tap changer and $\Delta t$ is a time interval.

8. The method according to claim 6, wherein said heat ($Q_{switching}$) generated due to switching of said tap changer is determined from:

$$Q_{switching} = \left[ R_{trans} I^2 \Delta t_1 + 2 R_{trans} \left[ \left( \frac{I}{2} \right)^2 + I_C^2 \right] \Delta t_2 + R_{trans} I^2 \Delta t_3 \right],$$

where $R_{trans}$ is a transition resistance of said tap changer, $I_C$ is a circulating current through said transition resistance and $\Delta t_1$, $\Delta t_2$, and $\Delta t_3$ are time intervals.

9. The method according to claim 1, wherein said step of obtaining said actual temperature ($T_{tap}$) of said fluid is dependent upon direct temperature measurements of said fluid.

10. The method according to claim 1, further comprising:
    obtaining a previous heat content ($Q_{tap}^{previous}$) of said fluid; and
    determining an expected temperature ($T_{tap}^{expected}$) of said fluid based on said expected amount of heat ($Q_{heat}^{expected}$) generated by said tap changer, said expected resulting heat exchange ($Q_{exchange}^{expected}$) of said tap changer and said previous heat content ($Q_{tap}^{previous}$) of said fluid, whereby said comparison is based on said expected ($T_{tap}^{expected}$) and said actual ($T_{tap}$) temperature of the fluid, respectively.

11. The method according to claim 10, wherein performing said diagnostics comprises:
    obtaining a ratio between said actual temperature ($T_{tap}$) of said fluid and said expected temperature ($T_{tap}^{expected}$) of said fluid.

12. The method according to claim 1, wherein said diagnostics actions comprise indication of error functioning.

13. An apparatus for condition diagnosing of a tap changer controlling an inductive power device, said tap changer being immersed in a fluid, the temperature of which is measured by a first thermometer, the apparatus comprising:
    means for determining an expected amount of heat generated by said tap changer;
    means for determining an expected resulting heat exchange of said tap changer; and
    performance means in connection with said first thermometer and said determining means, being arranged for performing diagnosing actions based on said actual temperature of said fluid, said expected amount of generated heat and said expected resulting heat exchange.

14. A tap changer controlling an inductive power device, said tap changer being immersed in a fluid, the temperature of which is measured by a first thermometer, and comprising condition diagnosing means, said condition diagnosing means comprising:

means for determining an expected amount of heat generated by said tap changer;

means for determining an expected resulting heat exchange of said tap changer; and performance means in connection with said first thermometer and said determining means, being arranged for performing diagnosing actions based on said actual temperature of said fluid, said expected amount of generated heat and said expected resulting heat exchange.

15. The tap changer according to claim 14, wherein said means for determining said expected resulting heat exchange of said tap changer comprises:

means for calculating a heat exchange between said inductive power device and said fluid; and means for calculating a heat exchange between the ambient air and said fluid.

16. The tap changer according to claim 15, wherein said means for calculating said heat exchange between the ambient air and said fluid is connected to said first thermometer and a second thermometer for measuring an ambient temperature.

17. The tap changer according to claim 15, wherein said means for calculating said heat exchange between said inductive power device and said fluid is connected to said first thermometers and a third thermometer for measuring a temperature of said inductive device.

18. The tap changer according to claim 14, wherein said means for determining said expected amount of heat generated by said tap changer is connected to a means for obtaining a value of a load current in said tap changer.

19. The tap changer according to claim 14, wherein said means for determining said expected amount of heat generated by said tap changer comprises:

means for calculating heat generated by a resistance of said tap changer; and means for calculating heat generated due to switching of said tap changer.

20. The tap changer according to claim 14, further comprising:

indicators in connection with said performance means being arranged for indicating error functioning.

21. The tap changer according to claim 14, wherein said inductive power device is a transformer.

22. The tap changer according to claim 14, wherein said inductive power device is a reactor.

23. An inductive power device system including an inductive power device being controlled by a tap changer, immersed in a fluid, the temperature of which is measured by a first thermometer, and comprising condition diagnosing means, said condition diagnosing means comprising:

means for determining an expected amount of heat generated by said tap changer;

means for determining an expected resulting heat exchange of said tap changer; and performance means in connection with said first thermometer and said determining means, being arranged for performing diagnosing actions based on said actual temperature of said fluid, said expected amount of generated heat and said expected resulting heat exchange.

24. A computer program product, comprising:

a computer readable medium; and computer code means and/or software code portions recorded on the computer readable medium for making a processor perform the steps of:

obtaining an actual temperature of a fluid in which a tap changer is immersed;

determining an expected amount of heat generated by said tap changer;

determining an expected resulting heat exchange of said tap changer; and performing diagnosing actions based on a comparison between said actual temperature of said fluid, said expected amount of generated heat and said expected resulting heat flow.

25. The computer program product according to claim 24, wherein the computer code means and/or software code portions recorded on the computer readable medium are further for making a processor perform the step of:

supplying the computer code means and/or software code portions via a network.

26. The computer program product according to claim 25, wherein the network is the internet.

27. A data signal comprising information concerning operation conditions of a tap changer controlling an inductive power device, said tap changer being immersed in a fluid, wherein said information is based on a comparison between an actual temperature of said fluid, an expected amount of heat generated by said tap changer and an expected resulting heat flow of said tap changer.

28. The data signal according to claim 27, wherein said information is at least partly formatted according to a standard suitable for a web technology means for communication and/or remote execution.

29. The data signal according to claim 27, wherein said data signal is received by a remote display means.

30. The data signal according to claim 27, wherein said data signal is received by a portable display means.

* * * * *